United States Patent
Venugopal et al.

(10) Patent No.: US 11,018,653 B1
(45) Date of Patent: May 25, 2021

(54) LOW VOLTAGE CLOCK SWING TOLERANT SEQUENTIAL CIRCUITS FOR DYNAMIC POWER SAVINGS

(71) Applicant: Apple Inc., Cupertino, CA (US)

(72) Inventors: Vivekanandan Venugopal, San Jose, CA (US); Ajay Bhatia, Saratoga, CA (US); Qi Ye, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/866,307

(22) Filed: May 4, 2020

(51) Int. Cl.
*H03K 3/012* (2006.01)
*H03K 3/037* (2006.01)

(52) U.S. Cl.
CPC .............. *H03K 3/012* (2013.01); *H03K 3/037* (2013.01)

(58) Field of Classification Search
None
See application file for complete search history.

(56) References Cited

U.S. PATENT DOCUMENTS

| | | | |
|---|---|---|---|
| 6,525,587 B2 | 2/2003 | Makino | |
| 8,373,483 B2 * | 2/2013 | Dally | H03K 3/356191 327/202 |
| 9,077,329 B2 * | 7/2015 | Elkin | H03K 3/356026 |
| 9,667,230 B1 * | 5/2017 | Fojtik | H03K 3/356113 |
| 9,973,191 B2 | 5/2018 | Klass | |
| 2006/0170480 A1 | 8/2006 | Chiu et al. | |
| 2015/0177824 A1 | 6/2015 | Ganpule et al. | |

FOREIGN PATENT DOCUMENTS

| | | |
|---|---|---|
| CN | 104320125 A | 1/2015 |
| JP | 2007335600 A | 12/2007 |

OTHER PUBLICATIONS

Asgari et al., "A Low-Power Reduced Swing Global Clocking Methodology", IEEE Transactions on Very Large Scale Integration (VLSI) Systems, May 2004, pp. 538-545, vol. 12, Issue 5.
Pangjun et al., "Low Power Clock Distribution Using Multiple Voltages and Reduced Swings", IEEE Transactions on Very Large Scale Integration (VLSI) Systems, Jun. 2002, 18 pages, vol. 10, Issue 3.
International Search Report and Written Opinion in International Application No. PCT/US2017/039423, dated Aug. 23, 2017, 13 pages.

* cited by examiner

*Primary Examiner* — Jeffery S Zweizig
(74) *Attorney, Agent, or Firm* — Kowert Hood Munyon Rankin and Goetzel PC; Rory D. Rankin

(57) ABSTRACT

Systems, apparatuses, and methods for implementing low voltage clock swing sequential circuits are described. An input signal is coupled to the gates of a first P-type transistor and a first N-type transistor of a first transistor stack. A low voltage swing clock signal is coupled to the gate of a second N-type transistor of the first transistor stack. An inverse of the input signal is coupled to the gates of a second P-type transistor and a third N-type transistor of a second transistor stack. The low-swing clock is coupled to the gate of a fourth N-type transistor of the second transistor stack. A first end of one or more enabling P-Type transistors with gates coupled to the low-swing clock is coupled to the first P-type transistor's drain, and a second end of the one or more enabling P-Type transistors is coupled to the second P-type transistor's drain.

20 Claims, 14 Drawing Sheets

US 11,018,653 B1

LOW VOLTAGE CLOCK SWING TOLERANT SEQUENTIAL CIRCUITS FOR DYNAMIC POWER SAVINGS

BACKGROUND

Technical Field

Embodiments described herein relate to the field of circuits and, more particularly, to reducing the voltage swing of clocks that control transitions in the circuit.

Description of the Related Art

Digital integrated circuits include one or more clocks to control transitions to cause sequential elements such as latches, flops, registers, memory arrays, etc. to capture and launch data. Distributing the clock over the semiconductor area occupied by the integrated circuit is challenging. At the high clock frequencies employed within many integrated circuits, the clock tree needs to be as balanced as possible, matching time lengths, loads, and delays from the clock source to the receiving circuitry. Fanout and load of the clock signals, and similarity of the buffering chains, is managed closely. If these parameters are not carefully managed, clock skew and jitter may increase, causing a reduction in the performance of the integrated circuit. These factors tend to lead to large and complex clock propagation networks, or clock trees, which consume a significant amount of power. The power consumption is significant not only because of the size and load of the clock tree, but also because the clock is toggling every clock cycle during operation. In some cases, clock power may be as much as 50% or more of the overall power consumption in an integrated circuit.

SUMMARY

Systems, apparatuses, and methods for implementing low voltage clock swing sequential circuits are contemplated. In one embodiment, an input signal is coupled to the gates of a first P-type transistor and a first N-type transistor of a first transistor stack. A low voltage swing clock signal is coupled to the gate of a second N-type transistor of the first transistor stack. An inverse of the input signal is coupled to the gates of a second P-type transistor and a third N-type transistor of a second transistor stack. The low voltage swing clock signal is coupled to the gate of a fourth N-type transistor of the second transistor stack. The circuit also includes one or more enabling P-Type transistors with gates coupled to the clock signal. A first end of the one or more enabling P-Type transistors is coupled to a drain of the first P-type transistor, and a second end of the one or more enabling P-type transistors is coupled to a drain of the second P-type transistor. When the clock signal is at a clock logic high level, the one or more enabling P-Type transistors are weakly off and counteracting the first and second P-type transistors. This allows the output data signal to swing to the full voltage range of the voltage supply even when the clock logic high level is some given percentage below the voltage level of the voltage supply.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
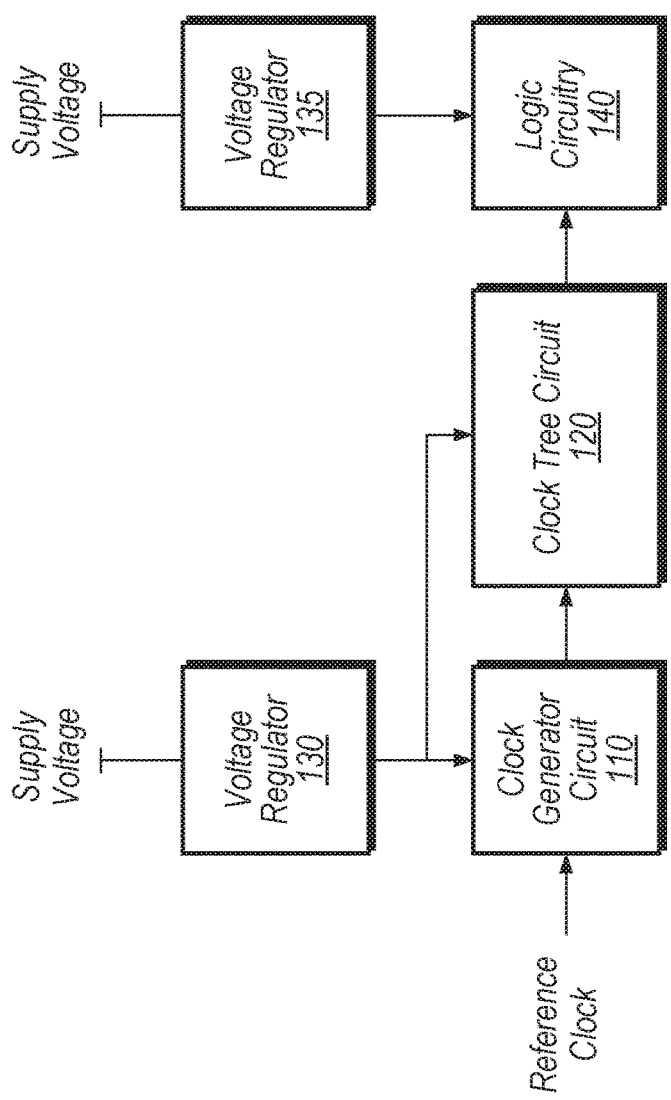
FIG. 1 is a generalized block diagram of one embodiment of an integrated circuit.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram of one embodiment of an integrated circuit (IC) 100 is shown. In one embodiment, IC 100 includes clock generator circuit 110, clock tree circuit 120, voltage regulators 130 and 135, and logic circuitry 140. In some embodiments, the components of IC 100 may actually be located in two or more separate IC's. Additionally, it should be understood that IC 100 may also include any number of other components which are not shown to avoid obscuring the figure.

Clock generator circuit 110 receives a reference clock and generates an output clock that is conveyed to clock tree circuit 120. Clock tree circuit 120 is coupled to provide any number of clock signals derived from the received clock to logic circuitry 140. Voltage regulator 130 generates a first supply voltage that powers clock generator circuit 110 and clock tree circuit 120. Voltage regulator 135 generates a second supply voltage that powers logic circuitry 140. In one embodiment, the magnitude of the first supply voltage is a predetermined amount (e.g., 25%) less than the magnitude of the second supply voltage. This allows the clock signal to have a reduced voltage swing as compared to the data signals in logic circuitry 140. This in turn helps to reduce the power consumption of IC 100. The methods and mechanisms for enabling logic circuitry 140 to function correctly when the clock signal has a reduced voltage swing as compared to the data signals will be described throughout the remainder of this disclosure.

The voltage regulators 130 and 135 may include any circuitry that is configured to generate one or more output voltages from a received input voltage. While two voltage regulators 130 and 135 are shown in FIG. 1, it should be understood that in another embodiment, a single voltage regulator could provide multiple output voltages to power clock generator circuit 110, clock tree circuit 120, and logic circuitry 140. Each output voltage is regulated in an attempt to produce a constant voltage magnitude under varying load conditions. Voltage regulators 130 and 135 may include various energy storage components such as combinations of inductors and capacitors to store energy from the input voltage to be provided to the receiving circuits to ensure that the output voltage is maintained.

The clock tree circuit 120 may generally include the circuitry configured to receive a source clock and distribute the clock to multiple clock sinks, with an attempt to match the delay and load to each sink to minimize the difference in time at which the clock arrives (e.g., skew and jitter). The clock sinks may be various clocked storage devices and other clocked elements in logic circuitry 140. Thus, while the clock tree circuit 120 is shown in between the clock generator circuit 110 and the logic circuitry 140, the clock tree circuit 120 may generally be distributed over the area occupied by the logic circuitry 140, and may deliver the clock to multiple physically distributed points within the area.

The logic circuitry 140 may include any combinatorial logic and clocked storage circuits such as latches, flops, registers, memory arrays, and so on. The clocks provided by the clock tree circuit 120 may be received by the clocked storage circuits and/or any other circuitry that may use a clock (e.g., dynamic logic circuitry). Each connection point to the clock tree circuit 120 may be a clock sink.

The clock generator circuit 110 may include any clock generation circuitry (e.g., phased locked loops (PLLs), delay locked loops (DLLs), clock dividers, clock multipliers). The clock generator circuit 110 may generate the clock from the reference clock (e.g., the frequency of the generated clock may be a multiple of the reference clock frequency). In one embodiment, a separate voltage regulator 130 powers the clock generator circuit 110 to prevent noise from the logic circuitry 140 from affecting clock generator circuit 110.

Figure 2:
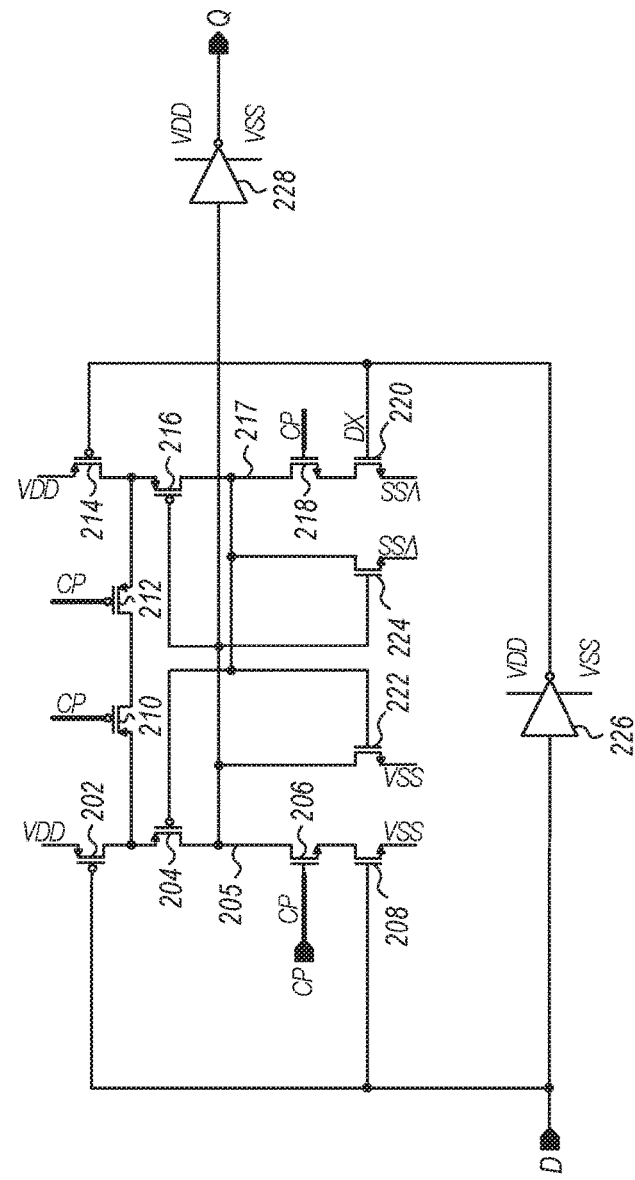
FIG. 2 is a circuit diagram illustrating one embodiment of a low swing clock latch circuit.

Turning now to FIG. 2, a circuit diagram of one embodiment of a low swing clock latch circuit 200 is shown. Low swing clock latch circuit 200 illustrates one example of a latch circuit which is transparent with clock high. As shown in FIG. 2, the input signal "D" is coupled to the gate of P-type transistor 202, to the gate of N-type transistor 208, and to the input port of inverter 226. The output port of inverter 226 is coupled to the gate of P-type transistor 214 and to the gate of N-type transistor 220. The output port of inverter 226 is also referred to as signal "DX" which is the inverse of the input signal "D". The source ports of P-type transistors 202 and 214 are connected to the supply voltage VDD. P-type transistors 210 and 212 are coupled in series in between the drain of P-type transistor 202 and the drain of P-type transistor 214. The source of P-type transistor 210 is coupled to the drain of P-type transistor 202 and the source of P-type transistor 212 is coupled to the drain of P-type transistor 214. The drain of P-type transistor 210 is coupled to the drain of P-type transistor 212. The clock signal "CP" is coupled to the gates of P-type transistors 210 and 212. Accordingly, when the clock signal "CP" is at a logic low level, P-type transistor 210 and P-type transistor 212 will both be conducting. This causes the drain of P-type transistor 202 and the drain of P-type transistor 214 to reach the level of the supply voltage VDD since either P-type transistor 202 or P-type transistor 214 will be conducting.

Transistors 204, 222, 216, and 224 are cross-coupled inverters that are enabled by pull-up transistors 202 and 214 to form a storage sub-circuit with nodes 205 and 217. A first inverter of the cross-coupled inverters includes P-type transistor 204 and N-type transistor 222. A second inverter of the cross-coupled inverters includes P-type transistor 216 and N-type transistor 224. P-type transistors 210 and 212 enable a path between the supply voltage and the storage sub-circuit when the clock signal "CP" is low by allowing current to flow from the supply voltage "VDD" through either P-type transistor 202 or P-type transistor 214. Only one of P-type transistor 202 or P-type transistor 214 can be enabled at any given time since the input signal "D" is coupled to the gate of P-type transistor 202 and the inverse of the input signal, or "DN", is coupled to the gate of P-type transistor 214

Figure 3:
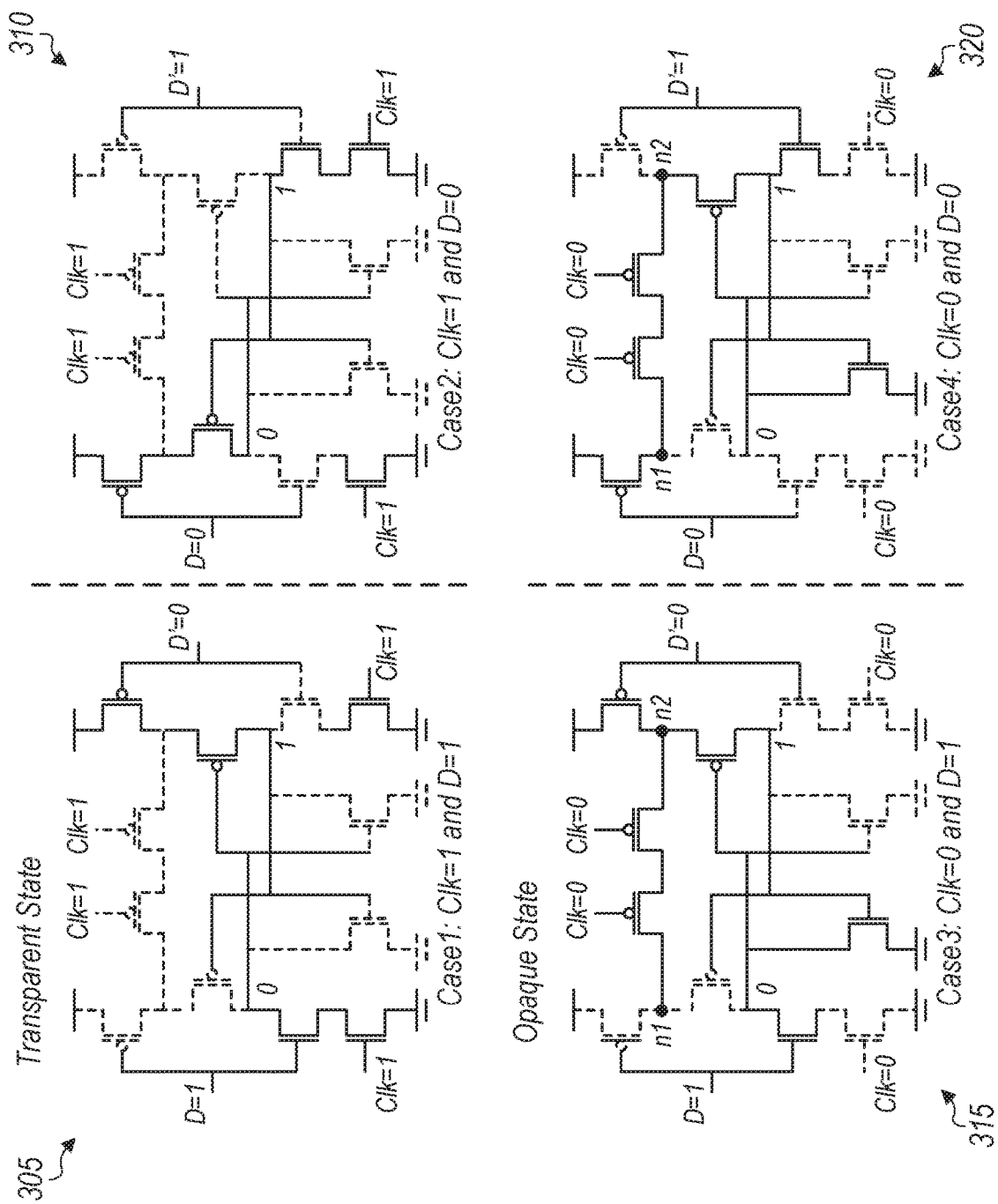
FIG. 3 is a diagram illustrating transparent and opaque states of the previous circuit diagram.

In one scenario, the logic high level of clock signal "CP" is equal to the supply voltage VDD of the transistors in circuit 200. This scenario is illustrated in the four diagrams shown in FIG. 3. The top-left diagram 305 of FIG. 3 illustrates the first case of circuit 200 when both clock and the input signal D are equal to 1. As shown in diagram 305, when both clock and the input signal D are equal to 1, N-type transistors 206 and 208 are conducting, causing the drain of N-type transistor 206 to be at the ground voltage. This results in the gate of P-type transistor 216 being at the ground voltage, which causes P-type transistor 216 to be conducting, which pulls the supply voltage VDD to the drain of P-type transistor 216 and to the gate of P-type transistor 204. This results in state node 205 being set to 0 and state node 217 being set to 1.

The top-right diagram 310 of FIG. 3 illustrates the operation of circuit 200 when the clock is high and the input signal D is low. As shown in diagram 310, when the clock is high and the input signal D is low N-type transistors 218 and 220 are conducting, causing the drain of N-type transistor 218 to reach ground. This results in the gate of P-type transistor 204 being at the ground voltage. This causes P-type transistor 204 to be conducting, which pulls the supply voltage VDD to the drain of P-type transistor 204 and to the gate of P-type transistor 216. This results in the node 205 being set to 1 and node 217 being set to 0.

The bottom-left diagram 315 of FIG. 3 illustrates the operation of circuit 200 when the clock is low and the input signal D is high. When the clock is low, the circuit 200 is in the opaque state and holds the previously stored state on nodes 205 and 217. While circuit 200 is in the opaque state, circuit 200 is not affected by the value of the input signal D. As shown in diagram 315, with the input signal D equal to 1, P-type transistor 214 is conducting, which brings the supply voltage VDD to the node n2. Since the clock is low, P-type transistors 210 and 212 are conducting, bringing the supply voltage through P-type transistors 212 and 210 to node n1. When the input signal D is low, as shown on the bottom-right diagram 320, P-type transistor 202 is conducting, which brings the supply voltage VDD to node n1 and through conducting P-type transistors 210 and 212 to node n2.

While the previous discussion described the scenario when the logic high level of clock signal "CP" is equal to the supply voltage VDD, circuit 200 can also operate when the logic high level of clock signal "CP" is less than the supply voltage VDD by a given amount. In one embodiment, the logic high level of clock signal "CP" is 75% of the supply voltage VDD. However, in other embodiments, the logic high level of clock signal "CP" is less than the supply voltage VDD by some other amount. When the logic high level of clock signal "CP" is less than the supply voltage VDD by a given amount, P-type transistors 210 and 212 are weakly off (i.e., partially on). As used herein, a transistor is defined as being "weakly off" when the voltage applied to the gate of the transistor is less than the supply voltage VDD by a given amount. In one embodiment, the given amount is a percentage in between 20% and 30%. Accordingly, since P-type transistors 210 and 212 are not turned totally off, there will be a weak path from VDD through P-type transistors 210 and 212 during the transparent state (i.e., when clk=1). During the transparent state and when the logic high level of clock signal "CP" is less than the supply voltage VDD by a given amount, P-type transistors 210 and 212 will fight against (i.e., counteract) the flow of current through the transistor stacks of nodes 205 and 217 when the values of nodes 205 and 217 are flipped.

The other connections of latch circuit 200 are as follows: The drain of N-type transistor 208 is coupled to the source of N-type transistor 206, while the gate of N-type transistor 222 is coupled to the gate of P-type transistor 204, to the drain of N-type transistor 224, and to the drain of N-type transistor 218. The drain of N-type transistor 222 is coupled to the drain of P-type transistor 204, the gate of P-type transistor 216, and the gate of N-type transistor 224. The gate of N-type transistor 218 is coupled to the clock signal "CP", while the source of N-type transistor 218 is coupled to the drain of N-type transistor 220. The gate of N-type transistor 220 is coupled to the output of inverter 226, which is referred to as "DX" which is the inverse of the input signal "D". The sources of N-type transistors 208, 222, 224, and 220 are coupled to ground (or "VSS").

The circuit arrangement of latch circuit 200 allows the clock logic high voltage to be significantly less than the voltage level of the voltage supply "VDD". This helps to reduce power consumption of latch circuit 200 by reducing the voltage swing between the clock logic low level and the clock logic high level. By operating the clock signal at a lower voltage level, a substantial reduction in power consumption can be achieved for integrated circuits with large numbers of sequential elements.

It is noted that, in various embodiments, a "transistor" can correspond to one or more transconductance elements such as a metal-oxide-semiconductor field-effect transistor (MOSFET), a junction field-effect transistor (JFET), a bipolar transistor, or others. For example, in one embodiment, each P-type transistor is a P-type metal-oxide-semiconductor field-effect transistor (MOSFET) and each n-type transistor is an n-type MOSFET. In other embodiments, the P-type transistors and N-type transistors shown in the circuits herein can be implemented using other types of transistors. It is also noted that the terms N-type and P-type can be used interchangeably with N-channel and P-channel, respectively. Although single devices are depicted in the circuit diagrams of this disclosure, in other embodiments, multiple devices may be used in parallel to form any of the above devices.

Figure 4:
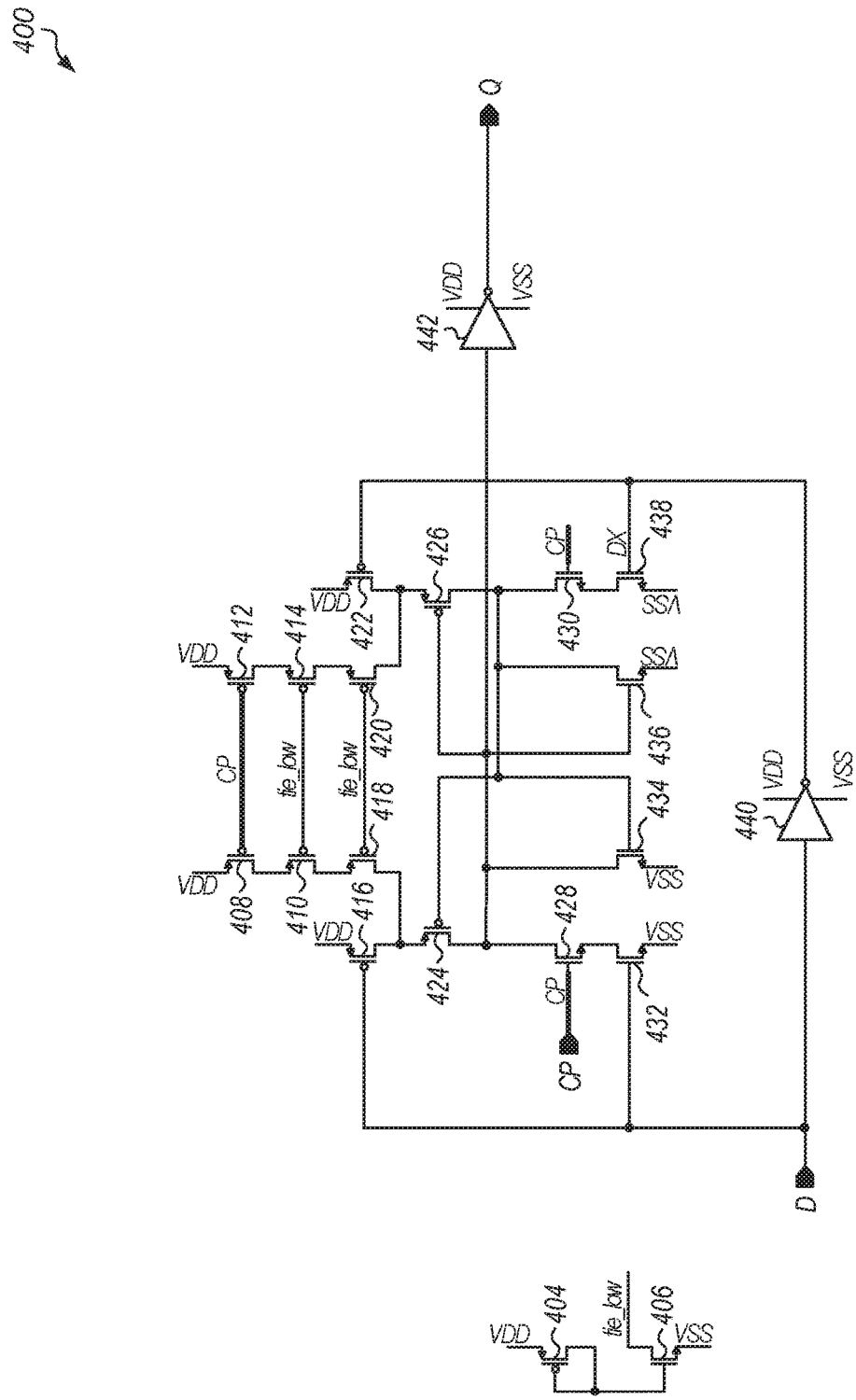
FIG. 4 is a circuit diagram of one embodiment of a low swing clock latch circuit.

Referring now to FIG. 4, a circuit diagram of one embodiment of a latch circuit 400 is shown. Latch circuit 400 illustrates an alternate circuit for implementing a latch for a clock signal that has a reduced high voltage level as compared to the voltage supply of the transistors. Differences between latch circuit 400 and latch circuit 200 (of FIG. 2) are shown at the top of latch circuit 400 for transistors 408, 410, 418, 412, 414, and 420. As shown, the clock signal is coupled to the gate of P-type transistor 408 and the gate of P-type transistor 412. The stack of P-type transistors 408, 410, and 418 are coupled between the supply voltage "VDD" and the drain of P-type transistor 416. Meanwhile, the stack of P-type transistors 412, 414, and 420 are coupled between VDD and the drain of P-type transistor 422. The "tie_low" signal is coupled between the gates of P-type transistors 410 and 414. Also, the "tie_low" signal is coupled between the gates of P-type transistors 418 and 420. The "tie_low" signal is generated by P-type transistor 404 and N-type transistor 406 shown on the left side of latch circuit 400, with the drain of P-type transistor 404 connected to the gate of P-type transistor 404 and to the gate of N-type transistor 406. The source of N-type transistor 406 is connected to ground and the source of P-type transistor 404 is connected to VDD. The "tie_low" signal is connected to the drain of N-type transistor 406.

In similar fashion to latch circuit 200, the input signal "D" is coupled to the gate of P-type transistor 416 and to the gate of N-type transistor 432 and through inverter 440 as inverted input signal "DX" to the gate of P-type transistor 422 and to the gate of N-type transistor 438. The N-type transistors 428, 430, 432, 434, 436, and 438 are connected in the same manner as the corresponding N-type transistors of latch circuit 200. Also, the connections from the input of inverter 442 to the drain of P-type transistor 424, drain of N-type transistor 434, and P-type transistor 426 are the equivalent of the corresponding connections of latch circuit 200.

Figure 5:
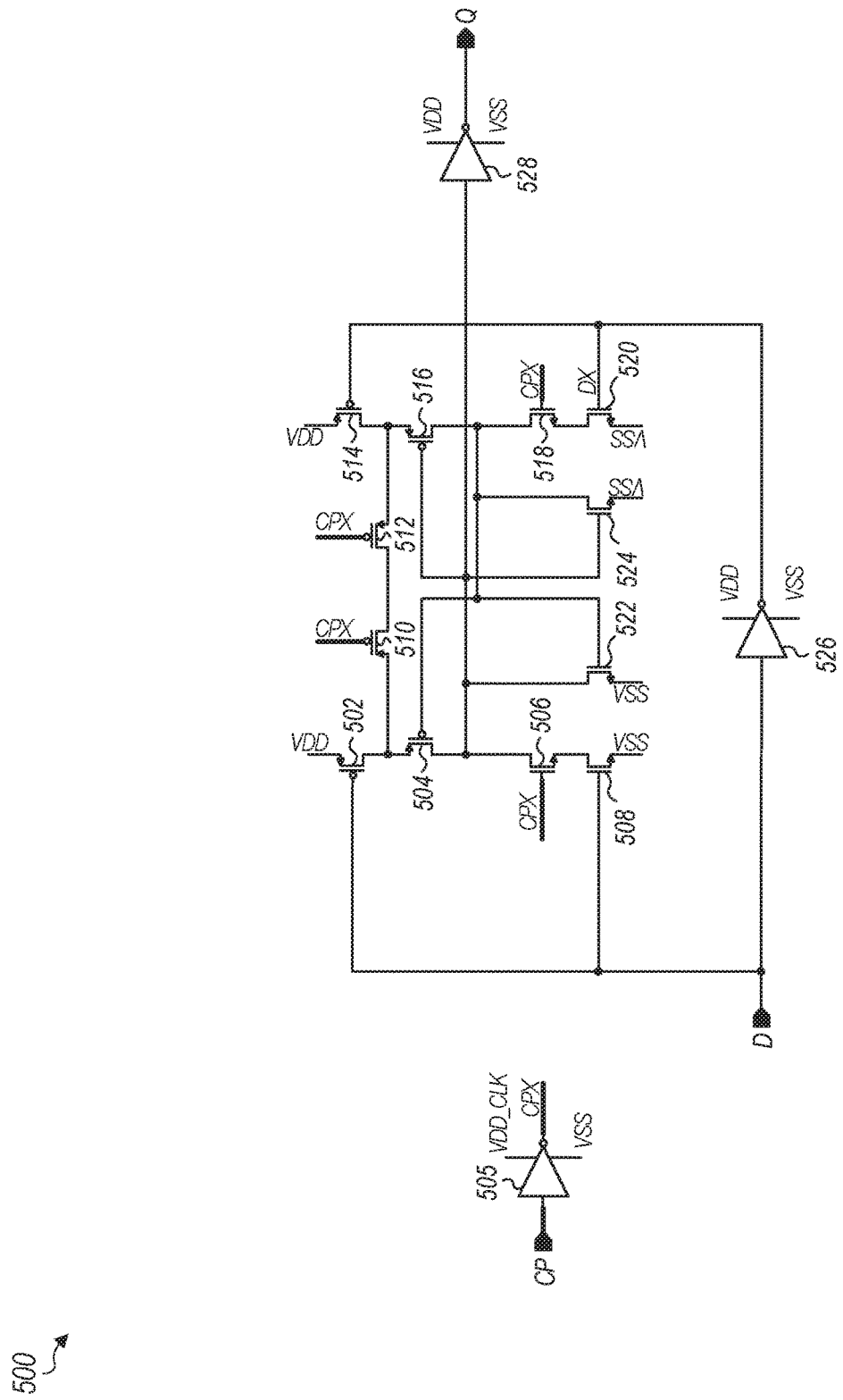
FIG. 5 is a circuit diagram of one embodiment of a low swing clock latch circuit.

Turning now to FIG. 5, a circuit diagram of one embodiment of a latch circuit 500 is shown. Latch circuit 500 includes the same arrangement of transistors as latch circuit 200, with the exception that the inverted clock signal "CPX" is connected to the gates of N-type transistors 506 and 518 and to the gates of P-type transistors 510 and 512. This is contrasted with latch circuit 200 which had the original, non-inverted clock signal "CP" coupled to the gates of the equivalent transistors. Clock signal "CP" is connected to inverter 505 which generates the inverted clock signal "CPX". As shown, inverter 505 is connected to a separate clock supply voltage "VDD CLK", which is lower than the main circuit supply voltage "VDD" by a given amount. Latch circuit 500 is transparent with clock low as compared to latch circuit 200 which is transparent with clock high. The other transistors 502, 504, 506, 508, 510, 512, 514, 516, 518, 520, 522, and 524 are similar to the corresponding transistors of latch circuit 200. Also, the inverters 526 and 528 are similar to the corresponding inverters of latch circuit 200.

Figure 6:
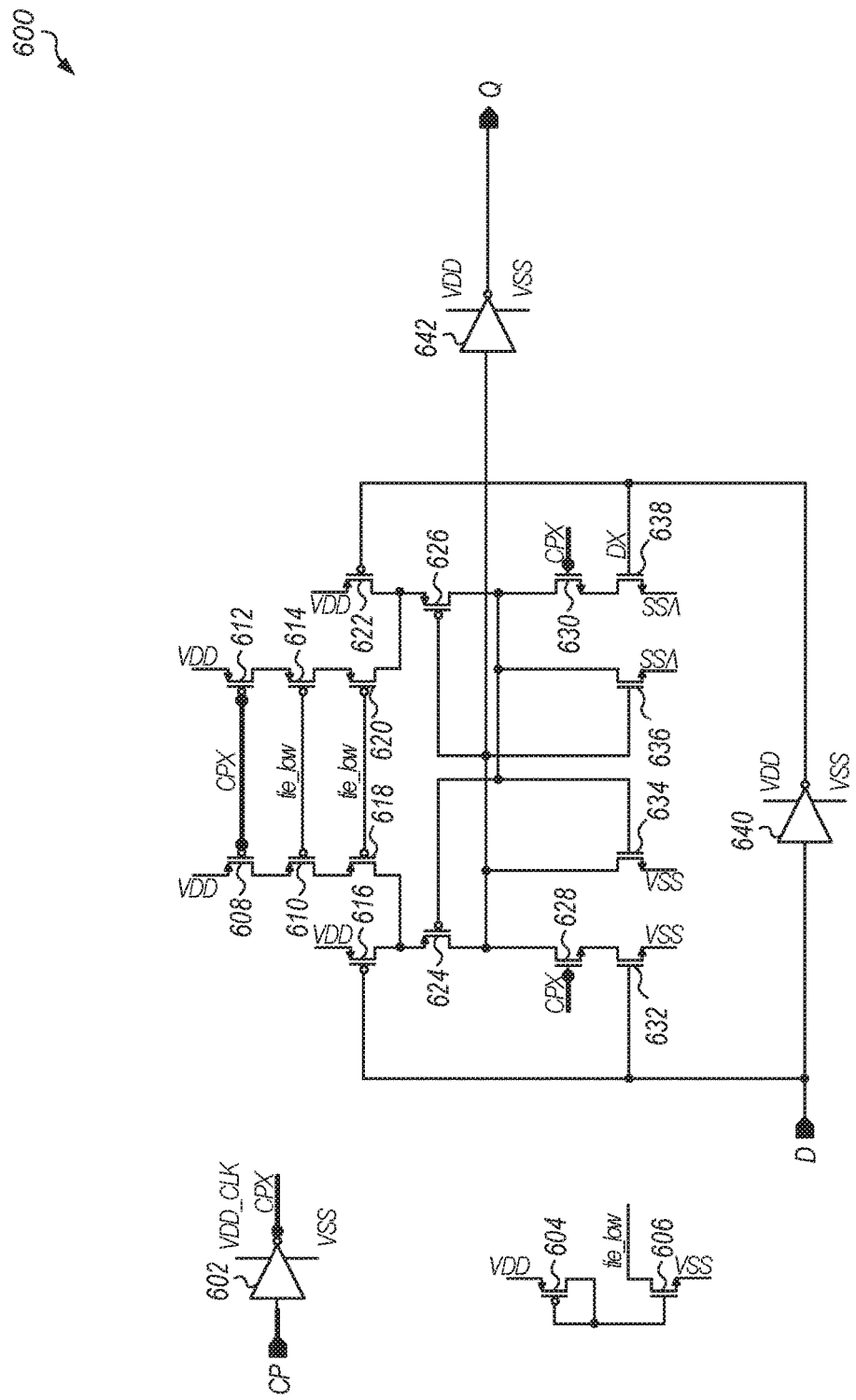
FIG. 6 is a circuit diagram of one embodiment of a low swing clock latch circuit.

Referring now to FIG. 6, a circuit diagram of one embodiment of a latch circuit 600 is shown. Latch circuit 600 includes the same arrangement of transistors as latch circuit 400, with the exception that the inverted clock signal "CPX" is connected to the gates of N-type transistors 628 and 630 and to the gates of P-type transistors 608 and 612. This is contrasted with latch circuit 400 which had the original, non-inverted clock signal "CP" coupled to the gates of the equivalent transistors. Clock signal "CP" is connected to inverter 602 which generates the inverted clock signal "CPX". Latch circuit 600 is transparent with clock low as compared to latch circuit 400 which is transparent with clock high. The layout and connections of transistors 604, 606, 608, 610, 612, 614, 616, 618, 620, 622, 624, 626, 628, 630, 632, 634, 636, and 638 of latch circuit 600 are similar to the corresponding transistors of latch circuit 400. Also, the connections for inverters 640 and 642 are similar to the connections for the corresponding inverters of latch circuit 400.

Figure 7:
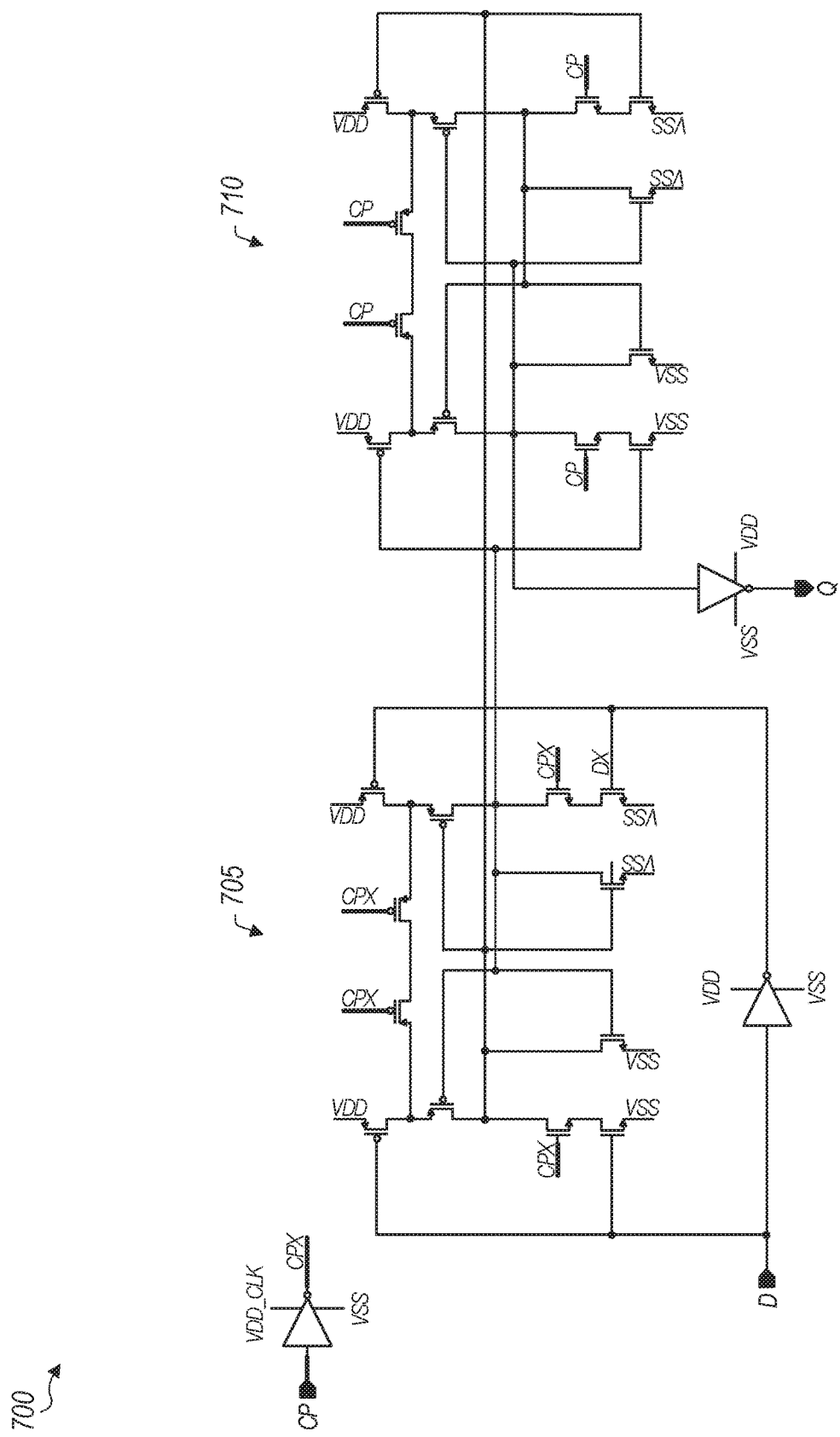
FIG. 7 is a circuit diagram of one embodiment of a low swing clock positive edge triggered flip-flop.

Turning now to FIG. 7, a circuit diagram of one embodiment of a low swing clock positive edge triggered flip-flop 700 is shown. As shown in FIG. 7, flip-flop 700 includes circuit 705 coupled to circuit 710. Circuit 705 includes the transistors and connections of latch 500 (of FIG. 5), while circuit 710 includes the transistors and connections of latch 200 (of FIG. 2). By connecting together the circuit arrangement of latch 500 followed by latch 200, a low swing clock positive edge triggered flip-flop 700 is constructed.

Figure 8:
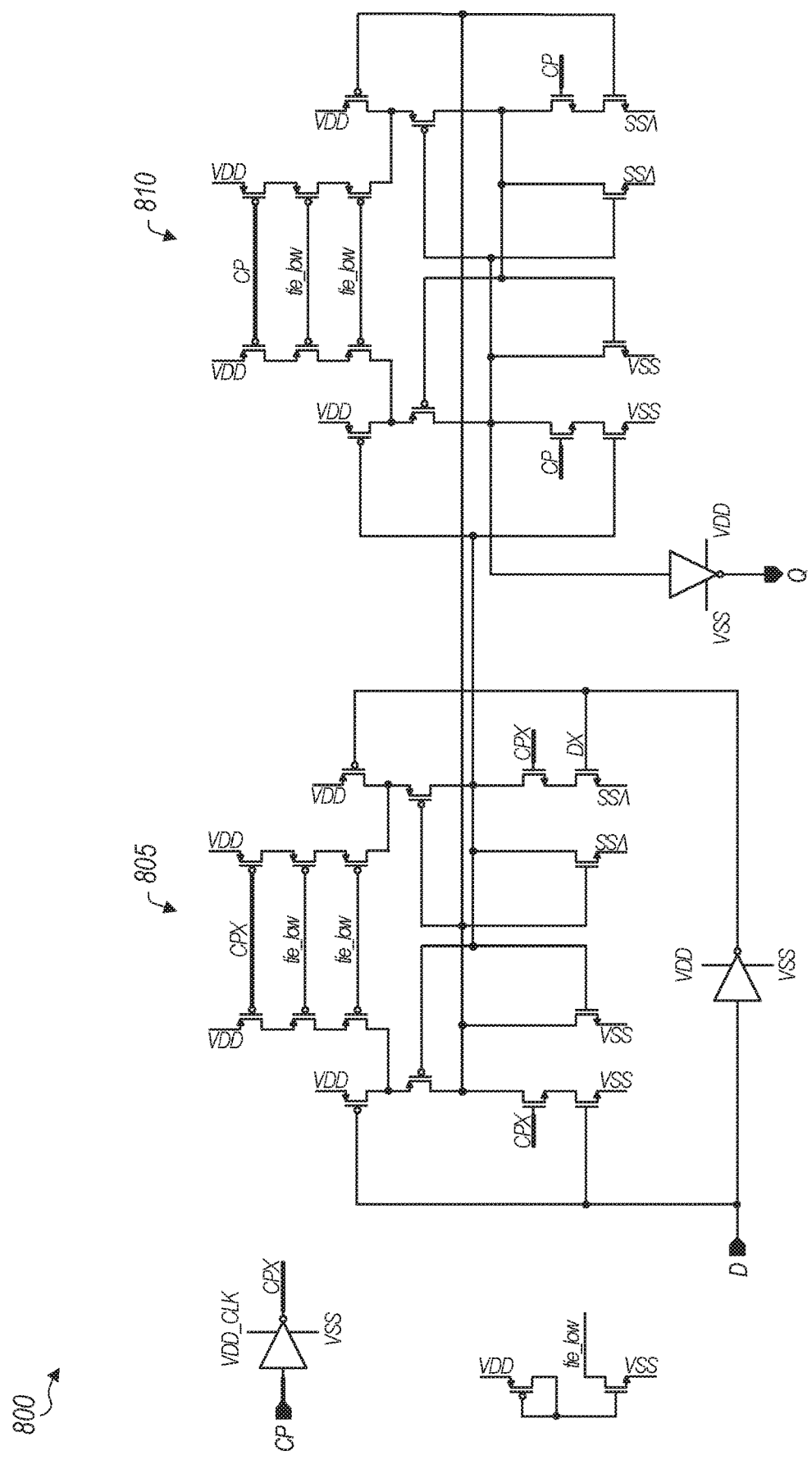
FIG. 8 is a circuit diagram of one embodiment of a low swing clock positive edge triggered flip-flop.

Referring now to FIG. 8, a circuit diagram of one embodiment of a low swing clock positive edge triggered flip-flop 800 is shown. As shown in FIG. 8, flip-flop 800 includes circuit 805 coupled to circuit 810. Circuit 805 includes the transistors and connections of latch 600 (of FIG. 6), while circuit 810 includes the transistors and connections of latch 400 (of FIG. 4). By connecting together the circuit arrangement of latch 600 followed by latch 400, a low swing clock positive edge triggered flip-flop 800 is constructed.

Figure 9:
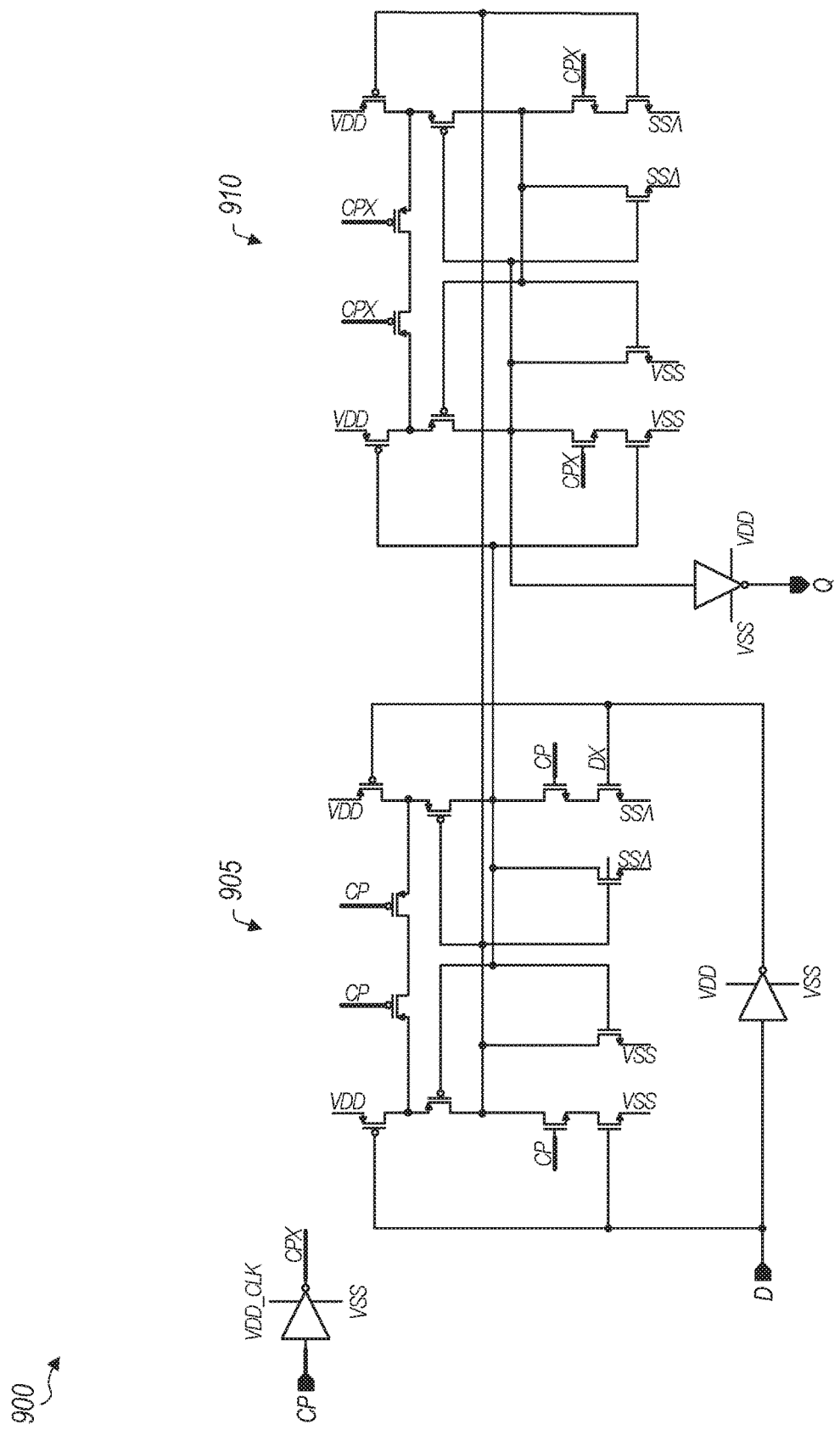
FIG. 9 is a circuit diagram of one embodiment of a low swing clock negative edge triggered flip-flop.

Turning now to FIG. 9, a circuit diagram of one embodiment of a low swing clock negative edge triggered flip-flop 900 is shown. As shown in FIG. 9, flip-flop 900 includes circuit 905 coupled to circuit 910. Circuit 905 includes the transistors and connections of latch 200 (of FIG. 2), while circuit 910 includes the transistors and connections of latch 500 (of FIG. 5). By connecting together the circuit arrangement of latch 200 followed by latch 500, a low swing clock negative edge triggered flip-flop 900 is constructed.

Figure 10:
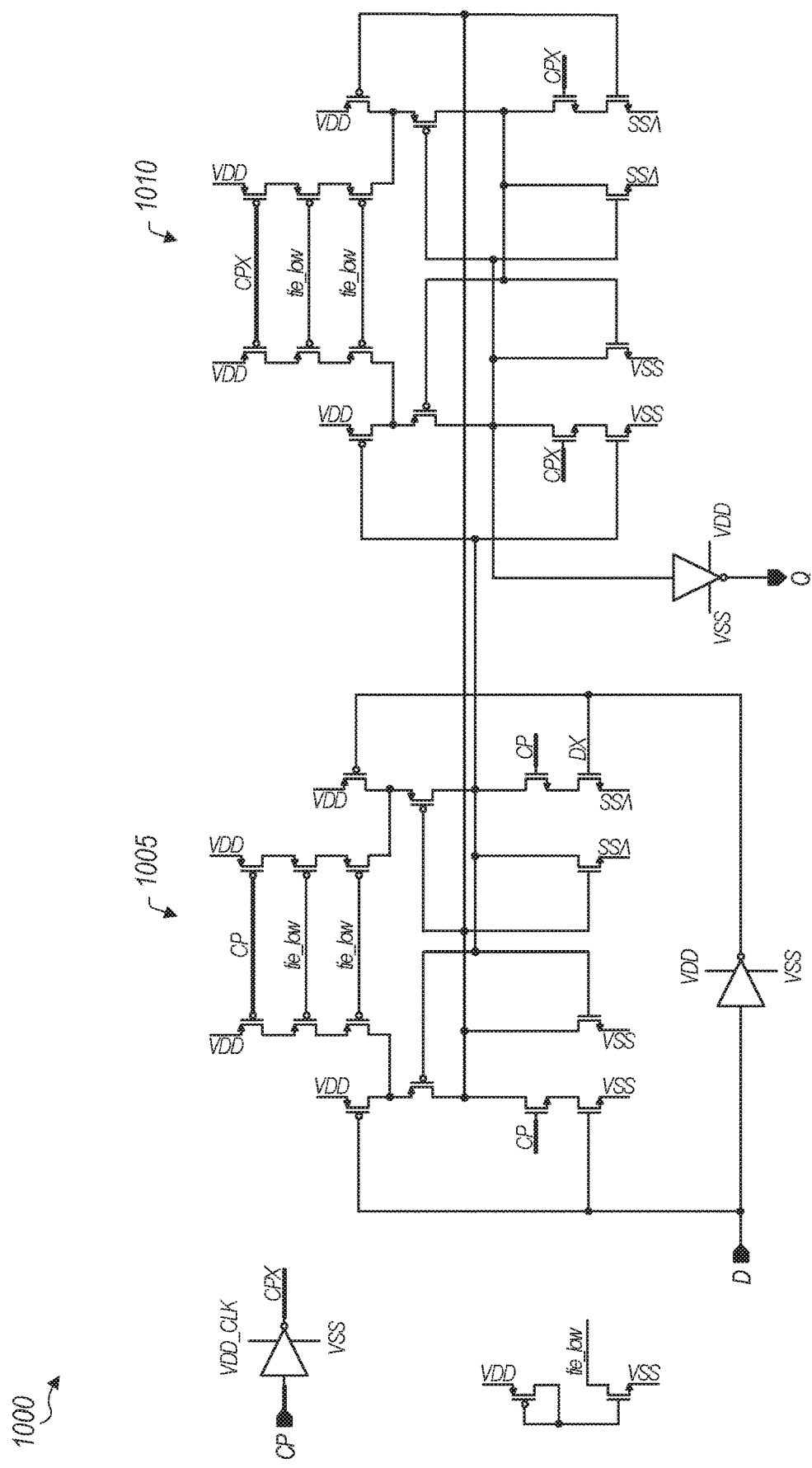
FIG. 10 is a circuit diagram of one embodiment of a low swing clock negative edge triggered flip-flop.
Figure 11:
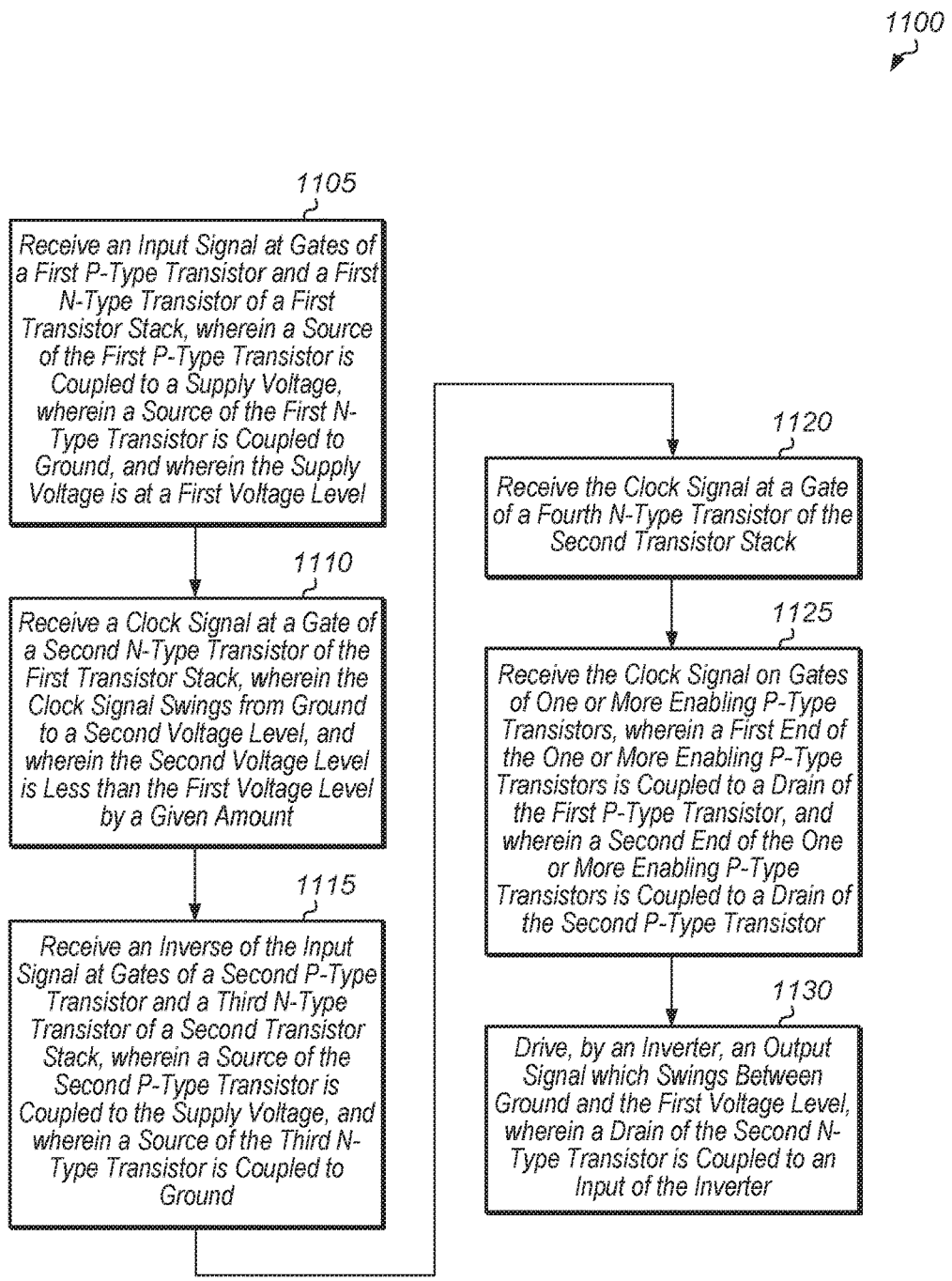
FIG. 11 is a flow diagram of one embodiment of a method for implementing a voltage clock swing tolerant sequential circuit.

Referring now to FIG. 10, a circuit diagram of one embodiment of a low swing clock negative edge triggered flip-flop 1000 is shown. As shown in FIG. 10, flip-flop 1000 includes circuit 1005 coupled to circuit 1010. Circuit 1005 includes the transistors and connections of latch 400 (of FIG. 4), while circuit 1010 includes the transistors and connections of latch 600 (of FIG. 6). By connecting together the circuit arrangement of latch 400 followed by latch 600, a low swing clock negative edge triggered flip-flop 1000 is constructed Turning now to FIG. 11, a generalized flow diagram of one embodiment of a method 1100 for implementing a low voltage clock swing tolerant sequential circuit is shown. For purposes of discussion, the steps in this embodiment (as well as for FIG. 12-13) are shown in sequential order. However, in other embodiments some steps may occur in a different order than shown, some steps may be performed concurrently, some steps may be combined with other steps, and some steps may be absent.

Gates of a first P-type transistor (e.g., P-type transistor 202 of FIG. 2) and a first N-type transistor (e.g., N-type transistor 208) receive an input signal, wherein a source of the first P-type transistor is coupled to a supply voltage, wherein a source of the first N-type transistor is coupled to ground, and wherein the supply voltage is at a first voltage level (block 1105). The gate of a second N-type transistor (e.g., N-type transistor 206) receives a clock signal, wherein the clock signal swings from ground to a second voltage level, and wherein the second voltage level is less than the first voltage level by a given amount (block 1110). In one embodiment, the given amount is in the range between 20% and 30%. For example, the supply voltage is 25% greater than the clock swing voltage in one implementation, with the swing of the input signal equal to the supply voltage. In another embodiment, the second voltage level is less than the first voltage level by a given voltage (e.g., 0.2 Volts). In one embodiment, the first P-type transistor, first N-type transistor, and second N-type transistor are part of a first transistor stack connected in series between a supply voltage and ground. The first transistor stack also includes a P-type transistor (e.g., P-type transistor 204) in between the first P-type transistor and the second N-type transistor.

Also, gates of a second P-type transistor (e.g., P-type transistor 214) and a third N-type transistor (e.g., N-type transistor 220) receive an inverse of the input signal, wherein a source of the second P-type transistor is coupled to the supply voltage, and wherein a source of the third N-type transistor is coupled to ground (block 1115). Still further, a gate of a fourth N-type transistor (e.g., N-type transistor 218) receives the clock signal (block 1120). In one embodiment, the second P-type transistor, third N-type transistor, and fourth N-type transistor are part of a second transistor stack connected in series between a supply voltage and ground. The second transistor stack also includes a P-type transistor (e.g., P-type transistor 216) in between the second P-type transistor and the fourth N-type transistor.

Also, gates of one or more enabling P-type transistors (e.g., P-type transistors 210 and 212) receive the clock signal, wherein a first end of the one or more enabling P-type transistors is coupled to a drain of the first P-type transistor, and wherein a second end of the one or more enabling P-type transistors is coupled to a drain of the second P-type transistor (block 1125). An inverter drives an output signal which swings between ground and the first voltage level, wherein a drain of the second N-type transistor is coupled to an input of the inverter (block 1130). After block 1130, method 1100 ends. By implementing method 1100, the clock signal is able to have a lower voltage swing from low to high than the difference between the logic circuitry's supply voltage and ground. This helps to reduce the power consumed by the clock tree in the overall circuit.

Figure 12:
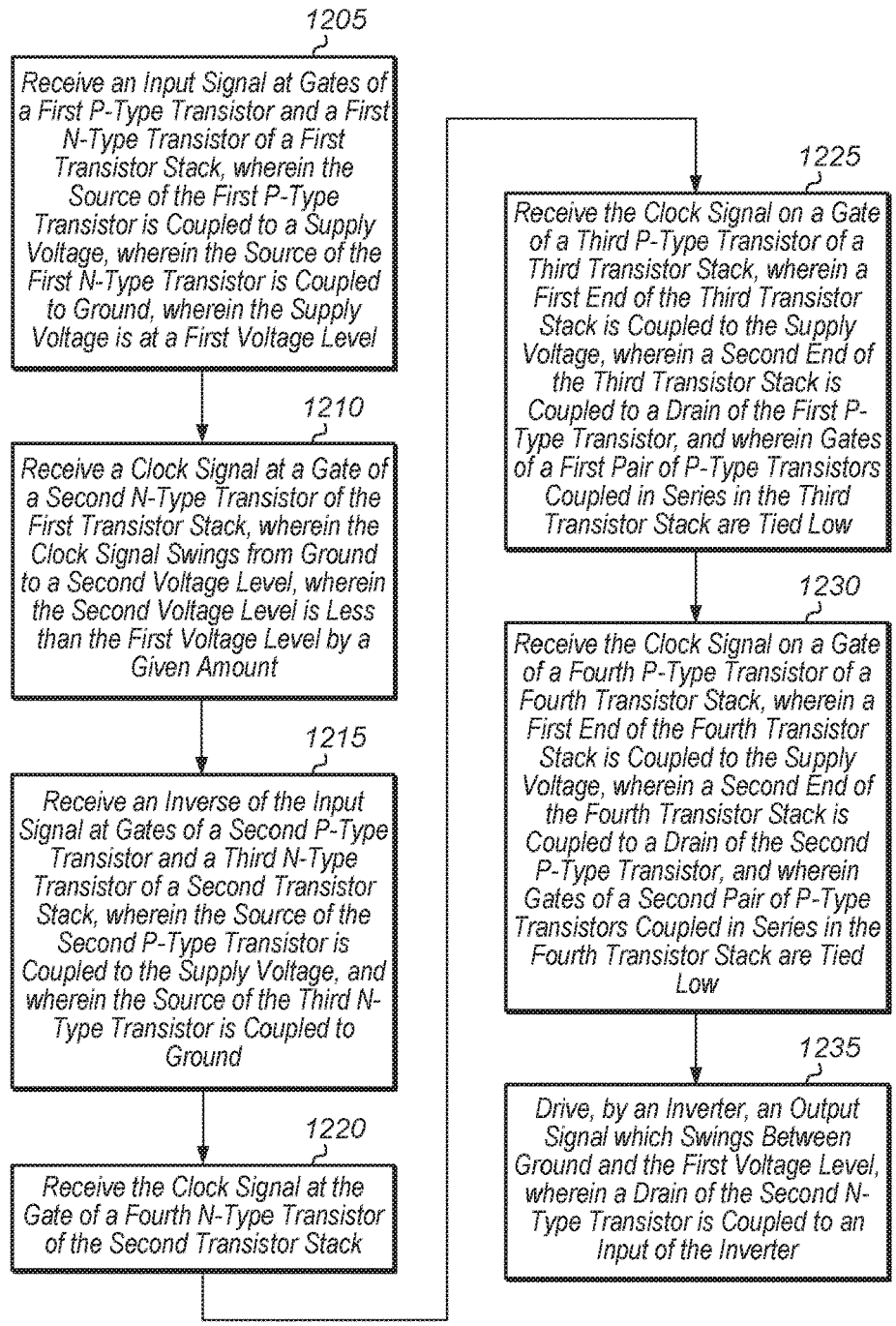
FIG. 12 is a flow diagram of one embodiment of a method for implementing a voltage clock swing tolerant sequential circuit.

Referring now to FIG. 12, one embodiment of a method 1200 for implementing a low voltage clock swing tolerant sequential circuit is shown. An input signal is received at gates of a first P-type transistor (e.g., P-type transistor 416 of FIG. 4) and a first N-type transistor (e.g., N-type transistor 432) of a first transistor stack, wherein the source of the first P-type transistor is coupled to a supply voltage, wherein the source of the first N-type transistor is coupled to ground, and wherein the supply voltage is at a first voltage level (block 1205). A gate of a second N-type transistor (e.g., N-type transistor 428) receives a clock signal, wherein the clock signal swings from ground to a second voltage level, wherein the second voltage level is less than the first voltage level by a given amount (block 1210). In one embodiment, the first P-type transistor, first N-type transistor, and second N-type transistor are part of a first transistor stack connected in series between a supply voltage and ground. The first transistor stack also includes a P-type transistor (e.g., P-type transistor 424) in between the first P-type transistor and the second N-type transistor.

Also, gates of a second P-type transistor (e.g., P-type transistor 422) and a third N-type transistor (e.g., N-type transistor 438) of a second transistor stack receive an inverse of the input signal, wherein the source of the second P-type transistor is coupled to the supply voltage, and wherein the source of the third N-type transistor is coupled to ground (block 1215). Still further, the gate of a fourth N-type transistor (e.g., N-type transistor 430) of the second transistor stack receives the clock signal (block 1220). In one embodiment, the second P-type transistor, third N-type transistor, and fourth N-type transistor are part of a second transistor stack connected in series between a supply voltage and ground. The second transistor stack also includes a P-type transistor (e.g., P-type transistor 426) in between the second P-type transistor and the fourth N-type transistor.

Also, a gate of a third P-type transistor (e.g., P-type transistor 408) of a third transistor stack receives the clock signal, wherein a first end (e.g., the source of P-type transistor 408) of the third transistor stack is coupled to the supply voltage, wherein a second end (e.g., the drain of P-type transistor 418) of the third transistor stack is coupled to a drain of the first P-type transistor, and wherein gates of a first pair of P-type transistors (e.g., P-type transistors 410 and 418) coupled in series in the third transistor stack are tied low (block 1225). Additionally, a gate of a fourth P-type transistor (e.g., P-type transistor 412) of a fourth transistor stack receives the clock signal, wherein a first end (e.g., the source of P-type transistor 412) of the fourth transistor stack is coupled to the supply voltage, wherein a second end (e.g., the drain of P-type transistor 420) of the fourth transistor stack is coupled to a drain of the second P-type transistor, and wherein gates of a second pair of P-type transistors (e.g., P-type transistors 414 and 420) coupled in series in the fourth transistor stack are tied low (block 1230). An inverter drives an output signal which swings between ground and the first voltage level, wherein a drain of the second N-type transistor is coupled to an input of the inverter (block 1235). After block 1235, method 1200 ends. Method 1200 provides an alternate way of reducing the power consumed by the clock tree in a circuit by allowing the clock swing to be lower than the voltage difference between ground and the supply voltage.

Figure 13:
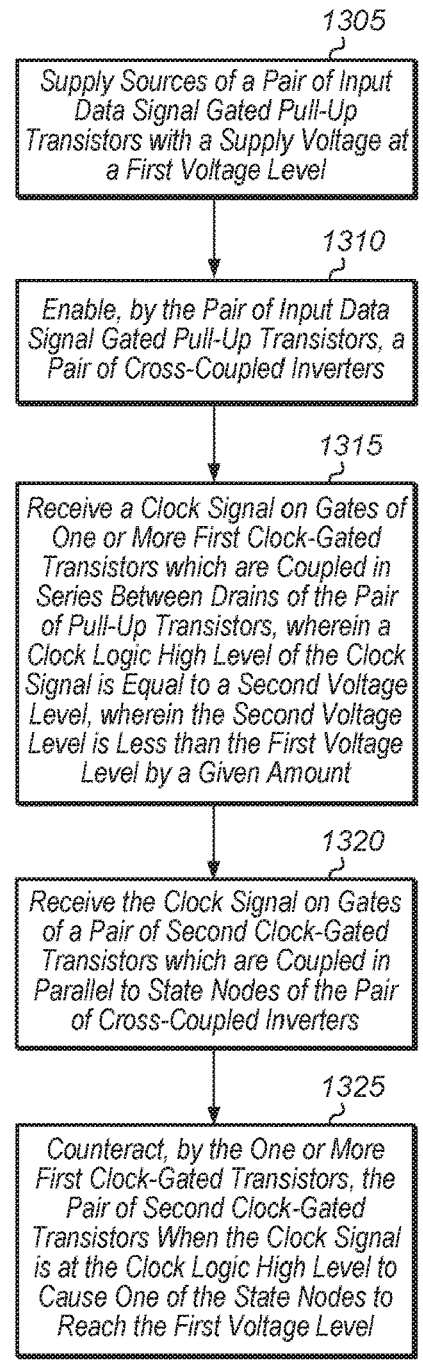
FIG. 13 is a flow diagram of one embodiment of a method for implementing a voltage clock swing tolerant sequential circuit.

Turning now to FIG. 13, one embodiment of a method 1300 for implementing a low voltage clock swing tolerant sequential circuit is shown. Sources of a pair of input data signal gated pull-up transistors (e.g., transistors 202 and 214) are supplied with a supply voltage at a first voltage level (block 1305). A pair of cross-coupled inverters (e.g., transistors 204, 222, 216, and 224 of FIG. 2) are enabled by the pair of input data signal gated pull-up transistors (block 1310). Also, a clock signal is received by gates of one or more first clock-gated transistors (e.g., transistors 210 and 212) which are coupled in series between drains of the pair of pull-up transistors, wherein a clock logic high level of the clock signal is equal to a second voltage level, wherein the second voltage level is less than the first voltage level by a given amount (block 1315).

Additionally, the clock signal is received by gates of a pair of second clock-gated transistors (e.g., transistors 206 and 218) which are coupled in parallel to state nodes of the pair of cross-coupled inverters (block 1320). The one or more first clock-gated transistors counteract the pair of second clock-gated transistors when the clock signal is at the clock logic high level to cause one of the state nodes to reach the first voltage level (block 1325). After block 1325, method 1300 ends.

Figure 14:
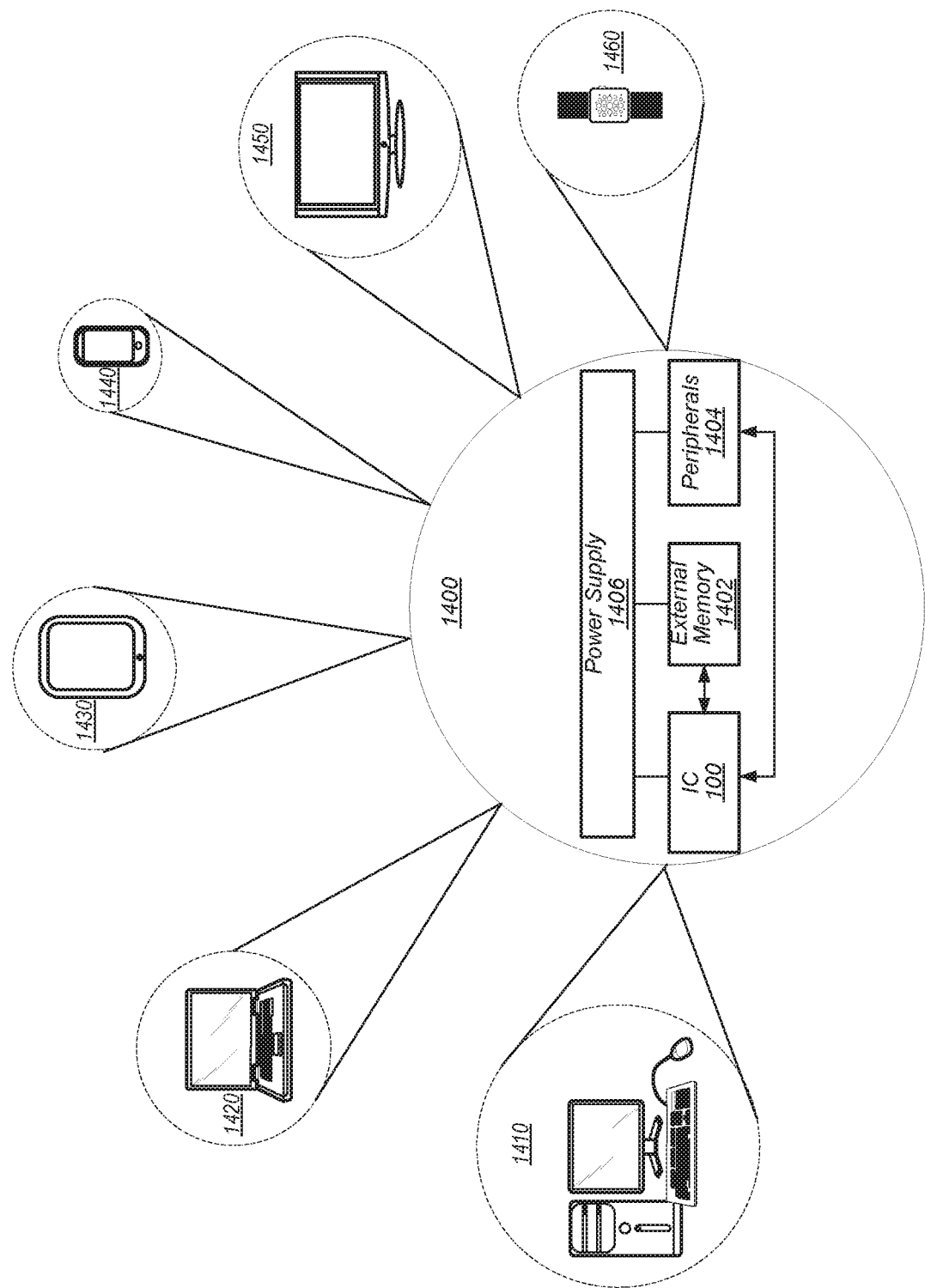
FIG. 14 is a block diagram of one embodiment of a system.

Referring now to FIG. 14, a block diagram of one embodiment of a system 1400 is shown. As shown, system 1400 may represent chip, circuitry, components, etc., of a desktop computer 1410, laptop computer 1420, tablet computer 1430, cell or mobile phone 1440, television 1450 (or set top box configured to be coupled to a television), wrist watch or other wearable item 1460, or otherwise. Other devices are possible and are contemplated. In the illustrated embodiment, the system 1400 includes at least one instance of integrated circuit (IC) 100 (of FIG. 1) coupled to one or more peripherals 1404 and the external memory 1402. A power supply 1406 is also provided which supplies the supply voltages to IC 100 as well as one or more supply voltages to the memory 1402 and/or the peripherals 1404. In various embodiments, power supply 1406 may represent a battery (e.g., a rechargeable battery in a smart phone, laptop or tablet computer). In some embodiments, more than one instance of IC 100 may be included (and more than one external memory 1402 may be included as well).

The memory 1402 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 1404 may include any desired circuitry, depending on the type of system 1400. For example, in one embodiment, peripherals 1404 may include devices for various types of wireless communication, such as wifi, Bluetooth, cellular, global positioning system, etc. The peripherals 1404 may also include additional storage, including RAM storage, solid state storage, or disk storage. The peripherals 1404 may include user interface devices such as a display screen, including touch display screens or multitouch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
   a pair of cross-coupled inverters enabled by a pair of pull-up transistors, wherein sources of the pair of pull-up transistors are coupled to a supply voltage at a first voltage level;
   one or more first clock-gated P-type transistors coupled in series between drains of the pair of pull-up transistors, wherein gates of the one or more first clock-gated P-type transistors are coupled to a clock signal, wherein a clock logic high level is equal to a second voltage level less than the first voltage level by a given amount; and
   a pair of second clock-gated transistors coupled in parallel to state nodes of the pair of cross-coupled inverters;
   wherein when the clock signal is at the clock logic high level, the one or more first clock-gated P-type transistors are configured to counteract the pair of second clock-gated transistors to cause one of the state nodes to reach the first voltage level.

2. The circuit as recited in claim 1, wherein the given amount is a percentage between 20% and 30%.

3. The circuit as recited in claim 1, wherein the one or more first clock-gated P-type transistors comprise two P-type transistors.

4. The circuit as recited in claim 1, wherein a drain of each transistor of the pair of second clock-gated transistors is coupled to a corresponding state node of the pair of cross-coupled inverters.

5. The circuit as recited in claim 4, wherein a source of each transistor of the pair of second clock-gated transistors is coupled to a drain of a corresponding transistor of a pair of pull-down transistors.

6. The circuit as recited in claim 5, wherein a gate of a first pull-down transistor of the pair of pull-down transistors is configured to receive an input signal, wherein a gate of a second pull-down transistor of the pair of pull-down transistors is configured to receive an inverse of the input signal, and wherein a data logic high level of the input signal is equal to the first voltage level.

7. The circuit as recited in claim 6, wherein a source of a first P-type transistor of the one or more first clock-gated P-type transistors is coupled to a drain of a first transistor of the pair of pull-up transistors, wherein a drain of the first P-type transistor of the one or more first clock-gated P-type transistors is coupled to a drain of a second P-type transistor of the one or more first clock-gated P-type transistors, and wherein a source of the second P-type transistor of the one or more first clock-gated P-type transistors is coupled to a drain of a second transistor of the pair of pull-up transistors.

8. A method comprising:
   supplying a pair of pull-up transistors with a supply voltage at a first voltage level;
   enabling, by the pair of pull-up transistors, a pair of cross-coupled inverters;
   receiving a clock signal at gates of one or more first clock-gated transistors which are coupled in series between drains of the pair of pull-up transistors, wherein a clock logic high level of the clock signal is equal to a second voltage level less than the first voltage level by a given amount;
   receiving the clock signal at gates of a pair of second clock-gated transistors which are coupled in parallel to state nodes of the pair of cross-coupled inverters; and
   counteracting the pair of second clock-gated transistors with the one or more first clock-gated transistors to cause one of the state nodes to reach the first voltage level when the clock signal is at the clock logic high level.

9. The method as recited in claim 8, wherein the one or more first clock-gated transistors comprise two P-type transistors.

10. The method as recited in claim 9, wherein a drain of a first P-type of the two P-type transistors is coupled to a drain of a second P-type transistor of the two P-type transistors.

11. The method as recited in claim 8, wherein a drain of each transistor of the pair of second clock-gated transistors is coupled to a corresponding state node of the pair of cross-coupled inverters.

12. The method as recited in claim 11, wherein a source of each transistor of the pair of second clock-gated transistors is coupled to a drain of a corresponding transistor of a pair of pull-down transistors.

13. The method as recited in claim 12, further comprising:
    receiving an input signal on a gate of a first pull-down transistor of the pair of pull-down transistors; and
    receiving an inverse of the input signal on a gate of a second pull-down transistor of the pair of pull-down transistors, wherein a data logic high level of the input signal is equal to the first voltage level.

14. The method as recited in claim 13, wherein a source of a first transistor of the one or more first clock-gated transistors is coupled to a drain of a first transistor of the pair of pull-up transistors, wherein a drain of the first transistor of the one or more first clock-gated transistors is coupled to a drain of a second transistor of the one or more first clock-gated transistors, and wherein a source of the second transistor of the one or more first clock-gated transistors is coupled to a drain of a second transistor of the pair of pull-up transistors.

15. A system comprising:
    a clock generator circuit; and
    logic circuitry comprising:
      a pair of cross-coupled inverters enabled by a pair of pull-up transistors, wherein sources of the pair of pull-up transistors are coupled to a supply voltage at a first voltage level;
      one or more first clock-gated transistors coupled in series between drains of the pair of pull-up transistors, wherein gates of the one or more first clock-gated transistors are coupled to a clock signal, wherein a clock logic high level of the clock signal is equal to a second voltage level less than the first voltage level by a given amount; and
      a pair of second clock-gated transistors coupled in parallel to state nodes of the pair of cross-coupled inverters;
      wherein when the clock signal is at the clock logic high level, the one or more first clock-gated transistors are configured to counteract the pair of second clock-gated transistors to cause one of the state nodes to reach the first voltage level.

16. The system as recited in claim 15, wherein the one or more first clock-gated transistors comprise two P-type transistors.

17. The system as recited in claim 16, wherein a drain of a first P-type transistor of the two P-type transistors is coupled to a drain of a second P-type transistor of the two P-type transistors.

18. The system as recited in claim 15, wherein a drain of each transistor of the pair of second clock-gated transistors is coupled to a corresponding state node of the pair of cross-coupled inverters.

19. The system as recited in claim 18, wherein a source of each transistor of the pair of second clock-gated transistors is coupled to a drain of a corresponding transistor of a pair of pull-down transistors.

20. The system as recited in claim 15, wherein a gate of a first pull-down transistor of the pair of pull-down transistors is configured to receive an input signal, wherein a gate of a second pull-down transistor of the pair of pull-down transistors is configured to receive an inverse of the input signal, and wherein a data logic high level of the input signal is equal to the first voltage level.

* * * * *